United States Patent
Xu

(10) Patent No.: US 9,502,300 B2
(45) Date of Patent: Nov. 22, 2016

(54) MEMS DEVICE AND FABRICATION METHOD THEREOF

(71) Applicant: Semiconductor Manufacturing International (Shanghai) Corporation, Shanghai (CN)

(72) Inventor: Wei Xu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/855,852

(22) Filed: Sep. 16, 2015

(65) Prior Publication Data

US 2016/0083248 A1 Mar. 24, 2016

(30) Foreign Application Priority Data

Sep. 24, 2014 (CN) .......................... 2014 1 0491246

(51) Int. Cl.
| | |
|---|---|
| H01L 21/82 | (2006.01) |
| H01L 21/8234 | (2006.01) |
| H01L 21/3213 | (2006.01) |
| H01L 21/3065 | (2006.01) |
| H01L 21/308 | (2006.01) |
| H01L 21/027 | (2006.01) |
| H01L 21/66 | (2006.01) |
| B81B 7/00 | (2006.01) |
| B81C 1/00 | (2006.01) |

(52) U.S. Cl.
CPC ..... *H01L 21/823437* (2013.01); *B81B 7/0058* (2013.01); *B81C 1/00333* (2013.01); *H01L 21/0276* (2013.01); *H01L 21/3065* (2013.01); *H01L 21/3081* (2013.01); *H01L 21/32139* (2013.01); *H01L 21/823431* (2013.01); *H01L 21/823481* (2013.01); *H01L 22/26* (2013.01)

(58) Field of Classification Search
CPC ................ H01L 21/823437; H01L 21/32139; H01L 21/3065
See application file for complete search history.

(56) References Cited

U.S. PATENT DOCUMENTS

| | | | | |
|---|---|---|---|---|
| 2013/0105921 A1* | 5/2013 | Najafi | ................. | G01P 15/0802 257/415 |
| 2014/0374851 A1* | 12/2014 | Liu | ..................... | B81C 1/00134 257/415 |

* cited by examiner

*Primary Examiner* — Matthew Reames
(74) *Attorney, Agent, or Firm* — Anova Law Group, PLLC

(57) ABSTRACT

The present disclosure provides a method for forming micro-electro-mechanical-system (MEMS) devices. The method includes providing a plurality of wafers; bonding a front surface of at least a first wafer onto a front surface of a second wafer; trimming an edge of and thinning the at least first wafer after the at least first wafer is bonded onto the second wafer; and bonding a first supporting plate onto a front surface of a third wafer. The method further includes thinning a back surface of the third wafer and forming alignment marks on a thinned back surface of the third wafer; bonding a second supporting plate onto the thinned back surface of the third wafer according to the alignment marks; and removing the first supporting plate and bonding the at least first wafer onto the third wafer according to the alignment marks to form a stack structure.

17 Claims, 4 Drawing Sheets

MEMS DEVICE AND FABRICATION METHOD THEREOF

CROSS-REFERENCES TO RELATED APPLICATIONS

This application claims the priority of Chinese Patent Application No. 201410491246.3 filed on Sep. 24, 2014, the entire content of which is incorporated herein by reference.

FIELD OF THE DISCLOSURE

The present disclosure relates to the field of semiconductor technology, more particularly, relates to an MEMS device and the fabrication method thereof.

BACKGROUND

Starting from the 80s in the twentieth century, with the development in micro-electro-mechanical-system (MEMS), miniaturization of some semiconductor devices, for example, various kinds of sensors, have been realized. Mass production has also been realized for producing these semiconductor devices and MEMS has become a main trend in future development.

In existing MEMS technology, an MEMS device is often formed from three stacked or bonded wafers. That is, three wafers are bonded or stacked together to form a stack structure and the stack structure is then diced to obtain the MEMS devices. In practice, the wafer in the middle has an arcuate or curved edge, and a great portion of side wafers might need to be reduced or thinned. To prevent the wafer in the middle from cracking during the wafer thinning process, the edge of the wafer in the middle needs to be trimmed. After the trimming process, gaps may be formed between the wafers around the edge of the wafer in the middle in the stack structure of three wafers. One or more wafers of the stack structure may be susceptible to cracking when, for example, during the thinning process of the top wafer to form the capping layer of the MEMS device, during the thinning process of the bottom layer to form the substrate of the MEMS device, or during the dicing process for dicing the thinned three-wafer structure. The cracking may affect the thinning and/or the dicing process, and may make it difficult or even impossible to obtain undamaged MEMS devices with small dimensions.

The disclosed methods and structures for forming MEMS devices to solve or improve, for example, the cracking problem during the fabrication process of MEMS devices and/or other problems.

BRIEF SUMMARY OF THE DISCLOSURE

One aspect of the present disclosure provides a method for forming micro-electro-mechanical-system (MEMS) devices. The method includes providing a plurality of wafers; bonding a front surface of at least a first wafer onto a front surface of a second wafer; trimming an edge of and thinning the at least first wafer after the at least first wafer is bonded onto the second wafer; and bonding a first supporting plate onto a front surface of a third wafer. The method further includes thinning a back surface of the third wafer and forming alignment marks on a thinned back surface of the third wafer; bonding a second supporting plate onto the thinned back surface of the third wafer according to the alignment marks; and removing the first supporting plate and bonding the at least first wafer onto the third wafer according to the alignment marks to form a stack structure.

Another aspect of the present disclosure provides a micro-electro-mechanical-system (MEMS) device. The MEMS device includes a plurality of wafers bonded together as a stack structure, a back surface of at least a first wafer being bonded onto a front surface of a second wafer and a front surface of the at least first wafer being bonded onto a front surface of a third wafer. Edges of the at least first wafer are trimmed and the at least first wafer is thinned; a back surface of the third wafer is thinned; and one the second wafer and the third wafer is a capping layer of the MEMS device and another of the second wafer and the third wafer is a substrate of the MEMS device.

Other aspects or embodiments of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

One or more layers of wafers may be susceptible to cracking when, for example, during the thinning process of the top wafer to form the capping layer of the MEMS device, during the thinning process of the bottom layer to form the substrate of the MEMS device, or during the dicing process of the thinned three-wafer structure.

To solve the above problems, the present disclosure provides a method to reduce the chances of cracking and to obtain MEMS devices with small dimensions. In the method, a first supporting plate is used to provide support when one of the first wafer and the second wafer is being thinned. The first wafer is positioned at the bottom of the stack structure for forming the substrate of the MEMS device. The second wafer is positioned at the top of the stack structure for forming the capping layer of the MEMS device. Alignment marks are marked on the thinned surface.

A second supporting plate is adhered or bonded to the thinned surface according to the alignment marks. After the first supporting plate is removed, the third wafer is bonded with the unthinned first wafer or the unthinned second wafer to form a stack structure of two wafers according to the alignment marks. The two-wafer structure may further be bonded with the thinned first wafer or the thinned second wafer to form the stack structure of three wafers. The third wafer may be used to form the movable electrodes of the MEMS devices. Thus, the second supporting plate may improve the supporting force of the thinned wafer in the above bonding process.

Further, the second supporting plate is removed and the thinned wafer with the alignment marks may be diced. A third supporting plate is bonded to the thinned surface of the diced wafer to improve the supporting force of the diced wafer such that the stack structure of three wafers is less susceptible to cracking when the unthinned wafer is being diced. The stack structure of three wafers may then be diced along same directions as the dice wafer to form individual MEMS devices. By using the three supporting plates (the first supporting plate, the second supporting plate, and the third supporting plate), undamaged MEMS devices of smaller dimensions may be obtained.

Figure 10:
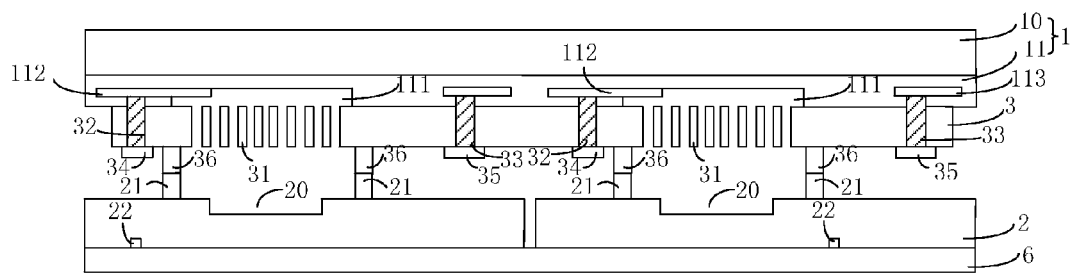
Figure 11:
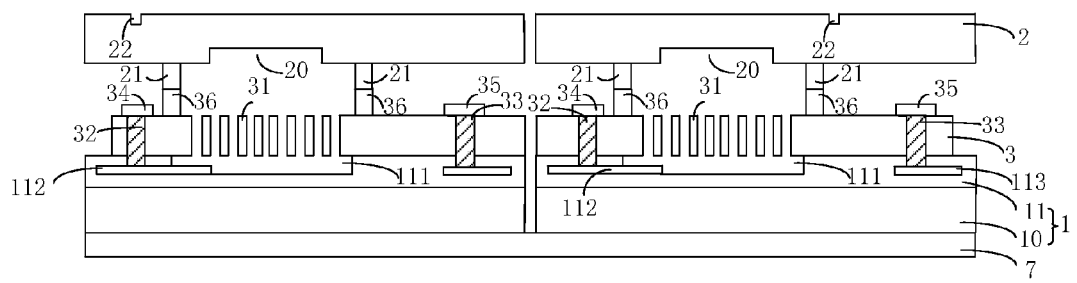
Figure 12:
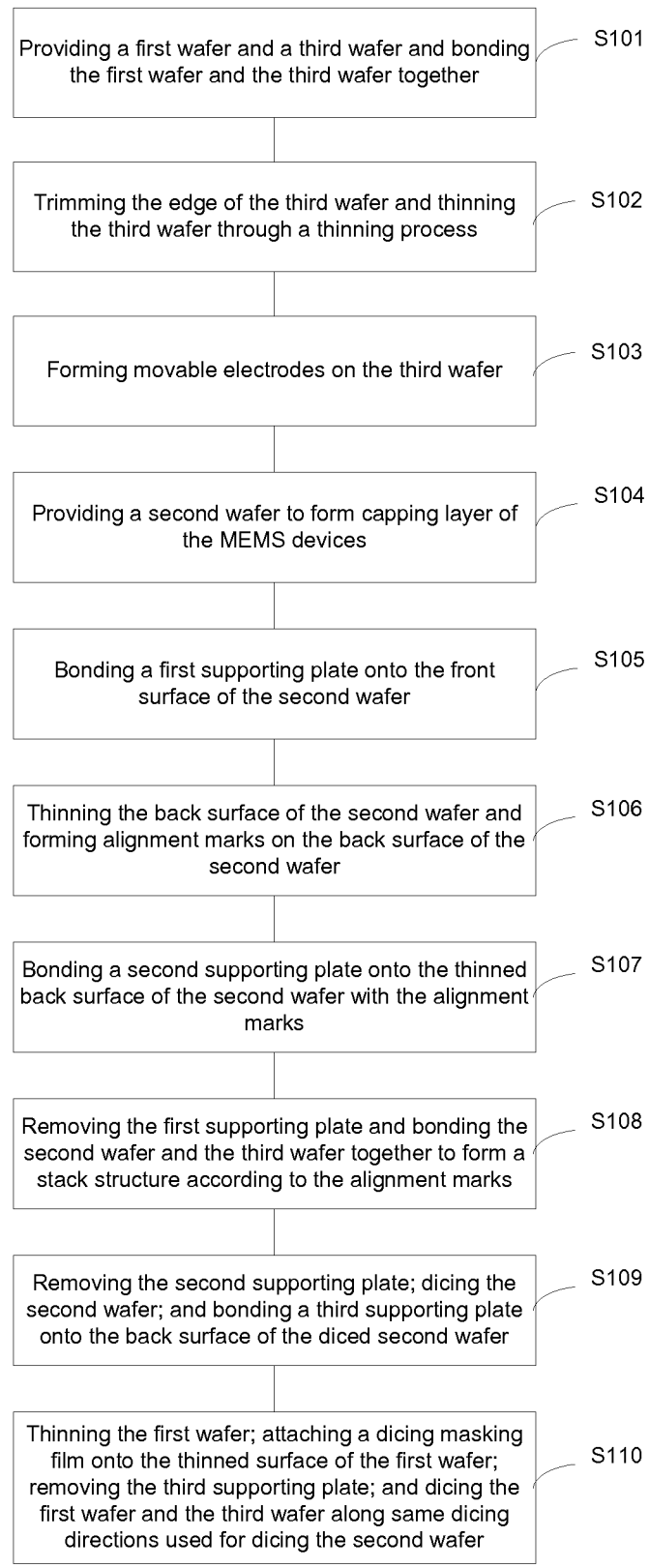
FIG. 12 illustrates an exemplary fabrication process of MEMS devices consistent with the embodiments of the present disclosure.

FIG. 12 illustrates an exemplary process for fabricating MEMS devices and FIGS. 1 to 11 illustrate certain device structures corresponding to various stages of an exemplary fabrication process of the MEMS devices.

Figure 1:
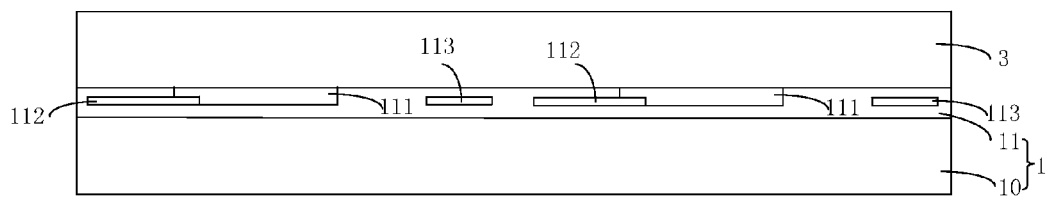
FIGS. 1 to 11 illustrate exemplary MEMS devices corresponding to certain stages of an exemplary fabrication process consistent with the disclosed embodiments of the present disclosure.

As shown in FIG. 12, at the beginning of the fabrication process, a first wafer and a third wafer are provided and bonded together (S101). FIG. 1 illustrates a corresponding device structure.

As shown in FIG. 1, a first wafer and a third wafer may be provided and bonded together. The first wafer 1 may be configured to form the substrate of the MEMS devices. The first wafer 1 may include a semiconductor substrate 10 and a dielectric layer 11 on the semiconductor substrate 10. The dielectric layer 11 may be configured to form metal-oxide-semiconductor field-effect transistors MOSFETs (not shown) and insulating structures for metal interconnects on the front surface of the semiconductor substrate 10.

FIG. 1 shows two metal wiring patterns 113, each may be connected to a plurality of MOSFETs on the front surface of the semiconductor substrate 10. In addition, the dielectric layer 11 may also include first trenches 111 and electrode panels 112. A first trench 111 may expose a portion of the corresponding electrode panel 112.

In one embodiment, the third wafer 3 may only include a semiconductor substrate. The semiconductor substrate may be made of any suitable materials, such as silicon. For illustrative purposes, only one wafer, wafer 3, is used to describe the fabrication process. In certain other embodiments, more than one wafer may be bonded to the first wafer 1 to form MEMS devices. The fabrication of the more than one wafer may be similar to the fabrication of wafer 3 and is not repeated herein.

Fusion bonding may be used to bond the first wafer 1 and the third wafer 3 together. That is, a chemical treatment may be performed on the silicon dioxide layer on the front surface of the third wafer 3 and on the silicon dioxide layer on the front surface of the first wafer 1 such that surface adhesion may be generated between the front surface of the first wafer 1 and the front surface of the third wafer 3. Specific fabrication parameters may be referred to the parameters used in any suitable fusion bonding process. The silicon dioxide layer may be a portion of the metal interconnects. The first trenches 111 may be formed by photolithography and/or a dry etch process.

In the S101, the first wafer 1 and the third wafer 3 may each have a regular thickness. In one embodiment, the thickness of the first wafer 1 and the third wafer 3 may each be about 725 µm.

Figure 2:
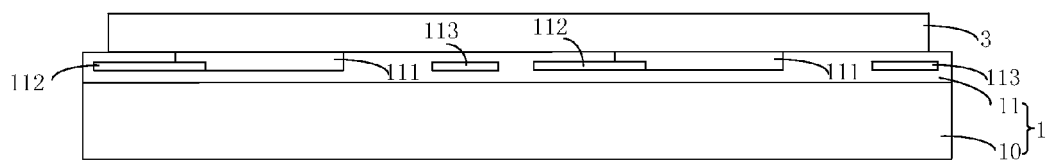

Referring to FIG. 12, after the first wafer and the third wafer are provided and bonded together, the edge of the third wafer is trimmed, and the third wafer is thinned through a thinning process (S102). FIG. 2 illustrates a corresponding device structure.

As shown in FIG. 2, the edge of the third wafer 3 may be trimmed. A thinning process may be subsequently performed to thin the third wafer after the trimming process.

The thinning process may reduce the thickness of a MEMS device. Since the edge of a regular wafer may be arcuate, trimming the edge of a wafer may prevent the wafer from cracking during a thinning process.

In practice, the portion of the third wafer 3 to be trimmed off from the edge of the wafer may be about 2 mm to about 4 mm. In one embodiment, the thickness of the third wafer 3 after the thinning process may range from about 20 µm to about 50 µm.

Figure 3:
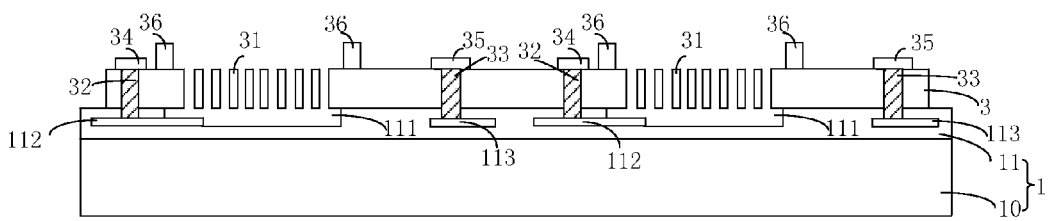

Referring to FIG. 12, after the third wafer is trimmed and thinned, movable electrodes may be formed on the third wafer (S103). The movable electrodes may be formed by photolithography and/or a dry etch process. FIG. 3 illustrates a corresponding device structure.

As shown in FIG. 3, movable electrodes 31 may be formed on the third wafer 3. The movable electrodes 31 may be formed using photolithography and/or a dry etch process.

Before the movable electrodes 31 are formed, a plurality of through-silicon holes or may be formed on the third wafer 3 after the third wafer 3 is thinned. Specifically, in one embodiment, the through-silicon holes may include first through-silicon holes, second through-silicon holes, and third through-silicon holes.

The bottom of a first through-silicon hole may expose a portion of an electrode panel 112, where the electrode panel 112 is configured to be a fixed electrode of an MEMS device. The bottom of a second through-silicon hole (not shown) may expose a portion of the silicon material for forming a movable electrode. The bottom of a third through-silicon hole may expose a portion of a metal wiring pattern 113. A layer of a conductive material, such as W and/or copper, may be formed on the third wafer 3, and a chemical mechanical polishing process may be performed to remove excessive conductive materials besides the through-silicon holes.

As shown in FIG. 3, first conductive silicon-through hole structures 32 may be formed to output the signals of the fixed electrodes 112, second conductive silicon-through hole structures (not shown) may be formed to output the signals of the movable electrodes 31, and third conductive silicon-through hole structures 33 may be formed to output the signals of the MOSFETs.

Further, as shown in FIG. 3, a first solder pad 34 may be formed on a first conductive silicon-through hole structure 32, a second solder pad (not shown) may be formed on a second conductive silicon-through hole structure (not shown), and a third solder pad 35 may be formed on a third conductive silicon-through hole structure 35. The solder pads may be formed to provide electrical connections with other various devices and/or components. In practice, the first solder pads 34 may be made of aluminum. The first solder pads 34 may be formed by photolithography and/or a dry etch process.

Further, as shown in FIG. 3, four first bumping structures 36 may be formed on the third wafer 3. The four first bumping structures 36 may be made of aluminum and may be formed by photolithography and/or a dry etch process. The four first bumping structures may correspond to the two MEMS devices. As shown in FIG. 3, the two first bumping structures 36 on a same side with a movable electrode 31 may each be on one side of the movable electrode 31.

That is, the two first bumping structures 36 on the left hand side of FIG. 3 may each be on one side of the movable electrode 31 on the left, corresponding to one MEMS device; and the two first bumping structures 36 on the right hand side of FIG. 3 may each be on one side of the movable electrode 31 on the right, corresponding to the other MEMS device. Then, photolithography and a dry etch process may be used to form the movable electrodes 31.

Figure 4:
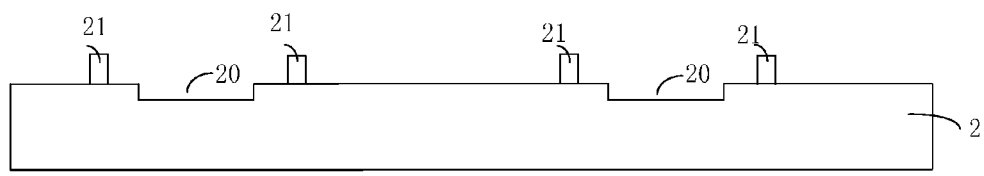

Referring to FIG. 12, after the movable electrodes are formed, a second wafer is provided to form the capping layer of the MEMS devices (S104). FIG. 4 illustrates a corresponding device structure.

As shown in FIG. 4, a second wafer 2 may be provided to form the capping layer of the MEMS devices. The second wafer 2 may have second trenches 20 on the front surface. The second wafer 2 may also include two second bumping structures 21 one on each side of a second trench 20.

Accordingly, the second wafer 2 may also correspond to the two MEMS devices to be formed. Although two MEMS devices are used for illustrative purposes, any number of MEMS devices may be included. Specifically, the second wafer 2 may be the capping layer of the two MEMS devices. Thus, the two second trenches 20 and the four second bumping structures 21 may correspond to the two MEMS devices to be formed.

As shown in FIG. 4, each second trench 20 and the two second bumping structures 21, one on each side of the second trench, may correspond to one MEMS device. For example, the second trench 20 on the left and the two second bumping structures 21 on both sides of the second trench 20 may correspond to one MEMS device. The second trench 20 on the right and the two second bumping structures 21 on both sides of the second trench 20 may correspond to the other MEMS device.

The second wafer 2 may have a regular thickness. In one embodiment, the thickness of the second wafer 2 may be about 725 μm.

The process to form the four second bumping structures 21 may be as follows. A silicon dioxide layer may be deposited on the front surface of the semiconductor substrate of the second wafer 2. A germanium layer may be deposited consecutively on the silicon dioxide layer. Photolithography and/or a dry etch process may be performed to etch the silicon dioxide layer and the germanium layer to form the second bumping structures 21. The second wafer 2 may include a semiconductor substrate made of silicon. The silicon dioxide layer may be used to enhance or improve the adhesion between the semiconductor substrate and the germanium layer.

A photoresist layer may be deposited on the four second bumping structures 21 and the rest of the front surface of the semiconductor substrate of the second wafer 2. After the photolithography, a dry etch process may be used to remove portions of the semiconductor substrate to form the second trenches 20.

Figure 5:
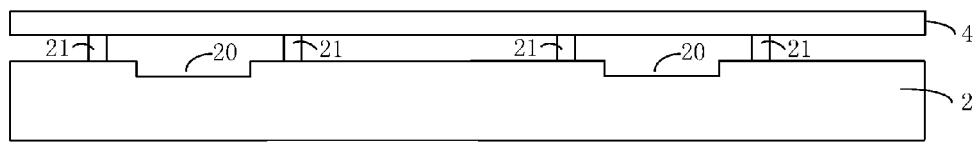

Referring to FIG. 12, after the second wafer is provided to form the capping layer of the MEMS devices, a first supporting plate is bonded onto the front surface of the second wafer (S105). FIG. 5 illustrates a corresponding device structure.

As shown in FIG. 5, a first supporting plate 4 may be bonded onto the front surface of the second wafer 2.

Specifically, the first supporting plate 4 may be a glass substrate or a die. In one embodiment, the first supporting plate 4 may be a glass substrate. The dimensions of the glass substrate may match or substantially match the dimensions of the first wafer 1 and the second wafer 2. The cost of a glass substrate may be lower than a die.

An ultraviolet (UV) curable adhesive may be used to bond the first supporting plate 4 to the front surface of the second wafer 2. Since the dimensions of the second bumping structures 21 may be sufficiently small, it is preferably to apply the UV curable adhesive on one side of the first supporting plate 4. The first supporting plate 4 may be aligned with the second wafer 2 with the side applied with the UV curable adhesive facing the second wafer 2.

After the first supporting plate 4 is aligned with the second wafer 2, the supporting plate 4 may be placed on the second wafer 2. Thus, the UV curable adhesive may stay between the second bumping structures 21 and the first supporting plate 4. When illuminated with UV light, the UV curable adhesive may undergo denaturation and the second bumping structures 21 may be bonded to the first supporting plate 4.

Figure 6:
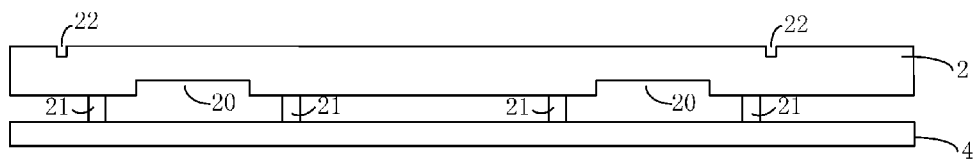

Referring to FIG. 12, after the first supporting plate is bonded onto the front surface of the second wafer, the back surface of the second wafer is thinned and marked with alignment marks (S106). FIG. 6 illustrates a corresponding device structure.

As shown in FIG. 6, the back surface of the second wafer 2 may be thinned and marked or labeled with alignment marks 22. The thinning process to thin the back surface of the second wafer 2 may be any suitable thinning process.

The alignment marks 22 formed on the thinned back surface of the second wafer 2 may be trenches. The alignment marks 22 may be formed by photolithography and/or a dry etch process.

It should be understood that, the first supporting plate 4 may support the second wafer 2 during the thinning process. In addition, since a glass substrate is used as the first supporting plate 4, the transparency of the glass substrate may make it easier to align the glass substrate from both the front side and the back side of the glass substrate when the alignment marks 22 are being formed.

Figure 7:
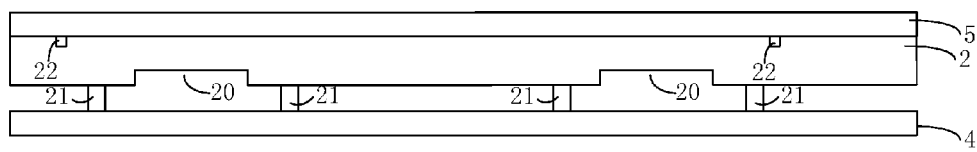

Referring to FIG. 12, after the back surface of the second wafer is thinned and marked with alignment marks, a second supporting plate is bonded onto the thinned back surface of the first supporting plate with the alignment marks (S107). FIG. 7 illustrates a corresponding device structure.

As shown in FIG. 7, a second supporting plate 5 may be bonded to the back surface of the thinned first second wafer 2 with the alignment marks 22.

The bonding process of the second supporting plate 5 may be referred to the bonding process for bonding the first supporting plate 4 and is not repeated herein.

It may be understood that, the fabrication steps illustrated from FIGS. 4 to 7 and FIGS. 1 to 3 do not need to be performed according to a fixed order. The fabrication steps may also be performed according to any suitable order, or performed separately and simultaneously.

Figure 8:
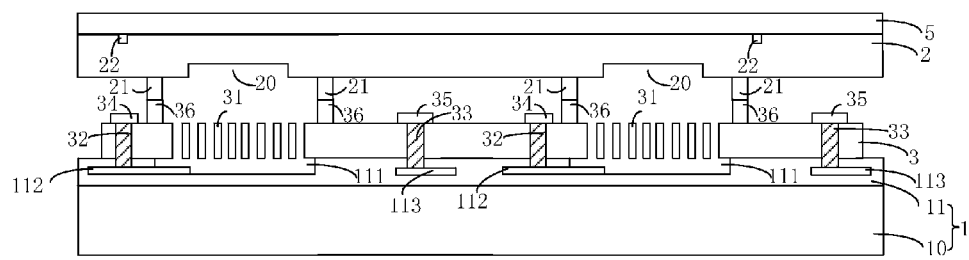

Referring to FIG. 12, after the second supporting plate is bonded to the thinned surface of the second wafer, the first supporting plate is removed and the second wafer and the third wafer are bonded together to form a stack structure according to the alignment marks (S108). FIG. 8 illustrates a corresponding device structure.

As shown in FIG. 8, the first supporting plate 4 is removed. The second wafer 2 and the third wafer 3 may be bonded together to form a stack structure according to the alignment marks 22. Each movable electrode 31 may be suspended in a cavity formed by a first trench 111 and a second trench 20.

In step S108, an organic solvent capable of dissolving the denatured UV curable adhesive may be used to remove the first supporting plate 4. The organic solvent may be toluene, and/or butanone.

In one embodiment, the bonding between the second wafer 2 and the third wafer 3 may be realized by the bonding between the first bumping structures 36 and the second bumping structures 21. The bonding may be eutectic bonding formed between aluminum and germanium. The fabrication parameters of the eutectic bonding may be referred to any suitable eutectic bonding process. In one embodiment, the first bumping structures 36 may be made of aluminum and the second bumping structures 21 may be made of germanium. In other various embodiments, the first bumping structures 36 may also be made of germanium and the second bumping structures 21 may be made of aluminum.

In step S108, the second supporting plate 5 may improve the supporting force of the thinned second wafer 2 when the second wafer 2 and the third wafer 3 are being bonded together.

Figure 9:
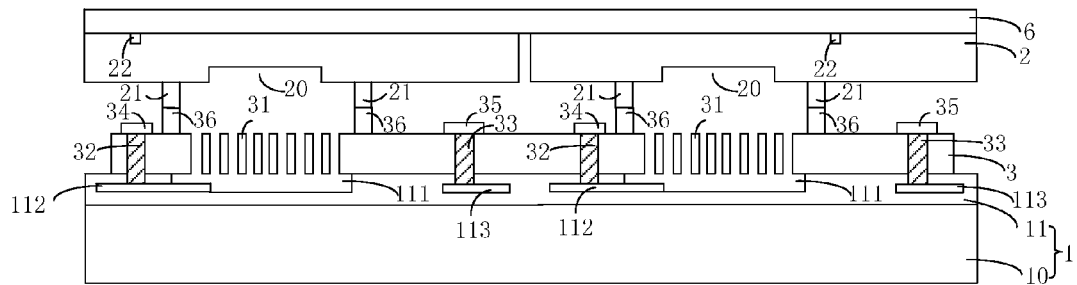

Referring to FIG. 12, after the first supporting plate is removed and the second wafer and the third wafer are bonded together to form a wafer stack, the second supporting plate is removed and the second wafer is diced. A third supporting plate is bonded onto the back surface of the diced second wafer (S109). FIG. 9 illustrates a corresponding device structure.

As shown in FIG. 9, the second supporting plate 5 may be removed and the second wafer 2 may be diced. A third supporting plate 6 may be bonded onto the back surface of the diced second wafer 2.

In one embodiment, the third supporting plate 6 may be a UV film with a thickness of about 400 µm to about 500 µm. In other various embodiments, the third supporting plate 6 may also be a glass substrate. Compared to a glass substrate, a UV film may be deformed and/or flexible and thus may be better attached to the second wafer 2. In practice, certain chemicals on or in the UV film, such as viscose, may keep the diced second wafer 2 as a whole piece. When illuminated with UV light, the chemicals, e.g., viscose, may undergo denaturation so that the UV film may be detached or separated from the second wafer 2. The process may be desirably simple and cheap.

In certain other embodiments, to ensure that the third supporting plate 6 provides sufficient support and desired attachment to the second wafer 2, the third supporting plate 6 may be placed directly against each diced piece of the second wafer 2. The third supporting plate 6 may also be a UV film with a glass substrate. The UV film may have a first surface and a second surface. The first surface of the UV film may be placed directly against the diced second wafer 2 to contact the diced second wafer 2. The second surface of the UV film may contact the glass substrate. It should be noted that, in this case, i.e., a UV film with a glass substrate, the thickness of the UV film may be thinner that the case of a UV film without a glass substrate.

Referring to FIG. 12, after the second supporting plate is removed and the second wafer is diced with the third supporting plate being bonded to the back of the diced second wafer, the first wafer is thinned and a dicing masking film is attached onto the thinned surface of the first wafer. The third supporting plate is removed, and the first wafer and the third wafer are diced along same dicing directions used for dicing the second wafer (S110). FIGS. 10 and 11 illustrate corresponding device structures.

As shown in FIGS. 10 and 11, the first wafer 1 may be thinned first. A dicing masking film 7 may be attached onto the thinned surface of the first wafer 1. The third supporting plate 6 may be removed. The first wafer 1 and the third wafer 3 may be diced along same dicing directions used for dicing the second wafer 2.

As shown in FIGS. 9 and 10, the stack structure formed by the first wafer 1, the third wafer 3, and the second wafer 2 may be flipped over. The second wafer 2 and third supporting plate 6 attached onto the second wafer 2 may be used as the support for the thinning of the back surface of the first wafer 1. The thinning process may be referred to any suitable existing thinning process and is not repeated herein.

It should be understood that, when the first wafer 1 is being thinned, the third supporting plate 6 may improve the support by the second wafer 2 after the second wafer 2 is thinned and diced.

After the first wafer 1 is thinned, the third supporting plate 6 may be removed. As shown in FIG. 11, the stack structure may be flipped over again such that the second wafer 2, the third wafer 3, and the first wafer 1 may be arranged from top to bottom. The third wafer 3 and the first wafer 1 may be diced from the top to the bottom along same directions used for dicing the second wafer 2 to form separate or individual portions. The dicing masking film 7 may be removed from the back surface of the first wafer 1 such that individual MEMS devices may be formed. The dicing process to dice the third wafer 3 and the first wafer 1 may be any suitable existing dicing process and is not repeated herein.

It should be understood that, after step S110 is complete, the stack structure, formed by three wafers, may be diced and separated into two separate individual portions, i.e., two MEMS devices. In other various embodiments of the present disclosure, other numbers of individual portions may also be obtained through dicing the stack structure. That is, other numbers of MEMS devices may be obtained through dicing the stack structure.

In the embodiment described above, as shown in FIG. 1, the third wafer 3 may first be bonded with the first wafer 1 to form a stack structure of two wafers. The first wafer 1 may be used as the substrate of the MEMS devices. The second wafer 2 may have been thinned before bonded to the stack structure of two wafers. The second wafer 2 may be used as the capping layer of the MEMS devices. In other various embodiments, the third wafer 3 may also be bonded with the second wafer 2, used as the capping layer of the MEMS devices, to form a stack structure of two wafers. The first wafer 1 may have been thinned before bonded to the stack structure of two wafers.

In the case that the first wafer 1 is thinned before bonded to the stack structure of two wafers, when the first wafer 1 is being thinned, the first supporting plate 4 may be attached to the front surface of the first wafer 1. Alignment marks 22 may be marked on the thinned surface after the thinning process is complete. The second supporting plate 5 may be attached to the thinned surface marked with the alignment marks 22. The first supporting plate 4 may be removed. The alignment marks 22 may be used for bonding the first wafer 1 onto the stack structure formed by the second wafer 2 and the third wafer 3.

In the bonding process described above, since the first wafer 1 is already thinned, the second supporting plate 5 attached to the thinned surface of the first wafer 1 may improve the support provided by the first wafer 1. The stack structure formed by the first wafer 1, the second wafer 2, and the third wafer 3 may be flipped over such that the first wafer 1 may be facing upward. The second supporting plate 5 may be removed and the thinned first wafer 1 may be diced. The third supporting plate 6 may be attached onto the thinned surface of the first wafer 1 to ensure that the diced first wafer 1 may still be kept as a whole piece. Being supported by the third supporting plate 6, the second wafer 2 may be thinned and the dicing masking film 7 may be attached onto the thinned surface of the second wafer 2. The second wafer 2 and the third wafer 3 may be diced along same directions used for dicing the first wafer 1 to form a plurality of MEMS devices (individual portions).

It may be shown that, in the case that the first wafer 1 is thinned before bonded to the stack structure of two wafers, when the first wafer 1 is being diced, the MEMS structure is flipped over. When the third wafer 3 and the second wafer 2 are being diced along same directions used for dicing the first wafer 1, the MEMS structure is also flipped over. Thus, compared to the this case, the method for forming the MEMS devices as illustrate in FIGS. 1 to 11 may reduce the chances of damages on the movable electrodes and other components during the flipping process.

Compared to existing MEMS technology, the method provided by the present disclosure has several advantages. First, being supported by the first supporting plate, one of the first wafer, positioned at the bottom and used for forming the substrate of the MEMS devices, and the second wafer, positioned at the top and used for forming the capping layer of the MEMS devices, may be thinned. Alignment marks may be labeled or formed on the thinned surface. Further, the second supporting plate may be attached onto the thinned surface with the alignment marks. After the first supporting plate is removed, the alignment marks may be used to align and bond the stack structure of two wafers, i.e., formed by the third wafer and the unthinned first/second wafer, with the thinned second/first wafer to form a stack structure of three wafers. The third wafer may be used to from movable electrodes of the MEMS devices. The second supporting plate may improve the support provided by the thinned wafer during the bonding process.

The second supporting plate may be further removed and the thinned wafer with the alignment marks may be diced. The third supporting plate may be attached onto the outer surface of the diced wafer. The third supporting plate may improve the support provided by the diced wafer. Thus, during the dicing process to dice the unthinned wafer of the stack structure, the stack structure of three wafers is less susceptible to cracking. Further, when dicing the stack structure of three wafers along the directions used for dicing the diced wafer, individual MEMS devices may be formed. Because of the use of the first supporting plate, the second supporting plate, and the third supporting plate, undamaged MEMS devices with small dimensions can be formed.

Optionally, the first supporting plate may be a glass substrate or a die. The dimensions of the glass substrate may match or substantially match the dimensions of the first wafer and the second wafer. Compared to a die, a glass substrate is cheaper. In addition, the transparency of a glass substrate may make it easier for the alignment during the formation of the stack structure of three wafers.

Optionally, the second supporting plate may be a glass substrate or a die. The dimensions of the glass substrate may match or substantially match the dimensions of the first wafer and the second wafer. Compared to a die, a glass substrate is cheaper. In addition, the transparency of a glass substrate may make it easier for the alignment during the formation of the stack structure of three wafers.

Optionally, the wafer with the alignment marks may be the second wafer on the top of the stack structure. The second wafer may be used for forming the capping layer of the MEMS devices. Compared to forming or labeling alignment marks on the back surface of the first wafer, positioned at the bottom of the stack structure for forming the substrate of the MEMS devices, forming alignment marks on the second wafer may reduce the number of time of flipping the MEMS devices. Damages to the movable electrodes and/or other components in the MEMS devices caused by the flipping process may be reduced.

Optionally, the fixed electrodes are formed on the front surface of the first wafer. Before forming the movable electrodes on the thinned third wafer, first through-silicon holes, second through-silicon holes, and third through-silicon holes may be formed on the thinned third wafer. The first through-silicon holes may be used for output the signals of the fixed electrodes. The second through-silicon holes may be used for output the signals of the movable electrodes. The third through-silicon holes may be used for output the signals for the MOSFETs. Compared to outputting the signals of the fixed electrodes, the movable electrodes, and the MOSFETs from the front surface or the back surface of the first wafer, outputting the signals from the through-silicon holes may improve the integration level of the MEMS devices.

Embodiments of the present disclosure further provide a MEMS device fabricated by the method disclosed, as shown in FIG. 11.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming micro-electro-mechanical-system (MEMS) devices, comprising:
   providing a plurality of wafers;
   bonding a front surface of at least a first wafer onto a front surface of a second wafer;
   trimming an edge of and thinning the at least first wafer after the at least first wafer is bonded onto the second wafer;
   bonding a first supporting plate onto a front surface of a third wafer,
   thinning a back surface of the third wafer and forming alignment marks on a thinned back surface of the third wafer;
   bonding a second supporting plate onto the thinned back surface of the third wafer according to the alignment marks; and
   removing the first supporting plate and bonding the at least first wafer onto the third wafer according to the alignment marks to form a stack structure.

2. The method according to claim 1, further including:
   removing the second supporting plate, dicing the third wafer, and attaching a third supporting plate onto the thinned back surface of the third wafer; and
   thinning the second wafer, removing the third supporting plate, and dicing the stack structure along directions used for dicing the third wafer to form the MEMS devices.

3. The method according to claim 2, wherein the second wafer is configured to form a capping layer of the MEMS devices and the third wafer is configured to form a substrate of the MEMS devices, or the second wafer is configured to form of a substrate of the MEMS devices and the third wafer is configured to form a capping layer of the MEMS devices.

4. The method according to claim 3, wherein
one of the second wafer and the third wafer includes metal-oxide-semiconductor field-effect transistors (MOSFETs), metal interconnects, and first trenches on a corresponding front surface; and
another one of the second wafer and the third wafer includes second trenches on a corresponding front surface.

5. The method according to claim 2, further including forming at least a plurality of movable electrodes on the at least first wafer after the at least first wafer is thinned and before the first supporting plate is bonded onto the front surface of the third wafer.

6. The method according to claim 5, wherein the movable electrodes are suspended in cavities formed by the first trenches and second trenches.

7. The method according to claim 2, wherein a process of removing the first supporting plate includes attaching a dicing masking film onto a thinned surface of the second wafer.

8. The method according to method in claim 2, wherein the first supporting plate is a glass substrate with dimensions matching dimensions of the second wafer and the third wafer.

9. The method according to claim 2, wherein the first supporting plate is bonded onto the third wafer using a ultraviolet curable adhesive.

10. The method according to claim 2, wherein the second supporting plate is a glass substrate with dimensions matching dimensions of the second wafer and the third wafer.

11. The method according to claim 2, wherein the third supporting plate is a ultraviolet film.

12. The method according to claim 5, further including:
forming fixed electrodes on the front surface of the second wafer; and
before forming the movable electrodes, on the at least first wafer, forming first conductive through-silicon hole structures for outputting signals of movable electrodes, second conductive through-silicon hole structures for outputting signals of the fixed electrodes, and third conductive through-silicon hole structures for outputting signals of the MOSFETs.

13. The method according to claim 12, further including forming a plurality of solder pads after the at least first wafer is thinned, wherein the plurality of solder pads are electrically connected to the fixed electrodes, movable electrodes, and the MOSFETs.

14. The method according to claim 13, wherein the plurality of solder pads are formed on the first conductive through-silicon hole structures, the second conductive through-silicon hole structures, and the third conductive through-silicon hole structures.

15. The method according to claim 2, wherein the alignment marks are trenches formed by photolithography, a dry etch process, or a combination of photolithography and a dry etch process.

16. The method according to claim 5, further including:
forming first bumping structures on the at least first wafer after the at least first wafer is thinned; and
before attaching the first supporting plate onto the third wafer, forming second bumping structures on the second wafer so that the first bumping structures and second bumping structures are bonded to form the cavities containing suspended movable electrodes when the stack structure is formed.

17. The method according to claim 16, wherein the first bumping structures are made of aluminum, and the second bumping structures are made of germanium; or the first bumping structures are made of germanium, and the second bumping structures are made of aluminum.

* * * * *